US010447216B1

(12) United States Patent
Aartsen (10) Patent No.: US 10,447,216 B1
(45) Date of Patent: Oct. 15, 2019

(54) LUMPED COMPENSATED OUTPHASING POWER COMBINER

(71) Applicant: Dialog Semiconductor B.V., s-Hertogenbosch (NL)

(72) Inventor: Wilhelmus Aart Johannes Aartsen, Haaksbergen (NL)

(73) Assignee: Dialog Semiconductor B.V., 'S-Hertogenbosch (NL)

( * ) Notice: Subject to any disclaimer, the term of this patent is extended or adjusted under 35 U.S.C. 154(b) by 0 days.

(21) Appl. No.: 16/022,871

(22) Filed: Jun. 29, 2018

(51) Int. Cl.
| H03F 1/07 | (2006.01) |
| H03F 3/21 | (2006.01) |
| H03F 3/00 | (2006.01) |
| H03F 1/56 | (2006.01) |
| H03F 1/02 | (2006.01) |

(52) U.S. Cl.
CPC ............... H03F 3/211 (2013.01); H03F 1/02 (2013.01); H03F 1/565 (2013.01); H03F 3/005 (2013.01); H03F 2203/45631 (2013.01); H03F 2203/45638 (2013.01)

(58) Field of Classification Search
CPC ................................ H03F 1/07; H03F 1/0288
USPC .............................................. 330/124 R, 295
See application file for complete search history.

(56) References Cited

U.S. PATENT DOCUMENTS

| 7,876,160 B2* | 1/2011 | Zhang | H03F 1/0277 330/124 R |
| 8,049,565 B2* | 11/2011 | Zhang | H03F 1/0277 330/295 |
| 8,717,102 B2* | 5/2014 | Wilson | H03F 3/193 330/124 R |
| 8,803,607 B2* | 8/2014 | Son | H03F 1/3241 330/107 |
| 8,890,618 B2* | 11/2014 | Pamarti | H03F 1/0294 330/124 R |

OTHER PUBLICATIONS

*Multiband RF Circuits and Techniques for Wireless Transmitters*, Copyright Springer-Verlag, Berlin Heidelberg 2016, Wenhua Chen, Karun Rawat, Fadhel M. Ghannouchi, p. 67, part of section 3.3.3.
"High Power Outphasing Modulation," by H. Chireix, Proceedings of the Institute of Radio Engineers, vol. 23, No. 11, Nov. 1935, pp. 1370-1392.
"Robust Circuit Design, Exploring the design space," found: https://www.robustcircuitdesign.com/signal-chain-exploree/lc-baluns-in-action/ Jun. 6, 2018, pp. 1-11.

\* cited by examiner

*Primary Examiner* — Henry Choe
(74) *Attorney, Agent, or Firm* — Saile Ackerman LLC; Stephen B. Ackerman (57) ABSTRACT

A power combiner for an outphasing amplifier system comprises an output terminal, a first input terminal, a first inductor, and a first capacitor, wherein the first input terminal is connected to ground via the first inductor and the first input terminal is connected to the output terminal via the first capacitor. The power combiner further comprises a second input terminal, a second capacitor, and a second inductor, wherein the second input terminal is connected to ground via the second capacitor and the second input terminal is connected to the output terminal via the second inductor. The first capacitor can have a same capacitance as the second capacitor and the first inductor has a same inductance as the second inductor.

17 Claims, 8 Drawing Sheets

LUMPED COMPENSATED OUTPHASING POWER COMBINER

TECHNICAL FIELD

The invention relates to an outphasing power combiner. The invention further relates to an amplifier system. The invention further relates to a method of a power combiner of an outphasing amplifier system.

BACKGROUND

Outphasing is a technique used to increase the efficiency of a power amplifier (PA) when it is not used at maximum output power (power back-off region). To achieve minimal power consumption the PA should achieve a high efficiency at peak power but also at power back off for modulating signals with varying envelope.

Conventional, non-switching PA's are typically quite inefficient at power back off, for example when amplifying AM modulated signals. Switching mode amplifiers on the other hand are usually non-linear, resulting in spectral spreading.

Figure 1:
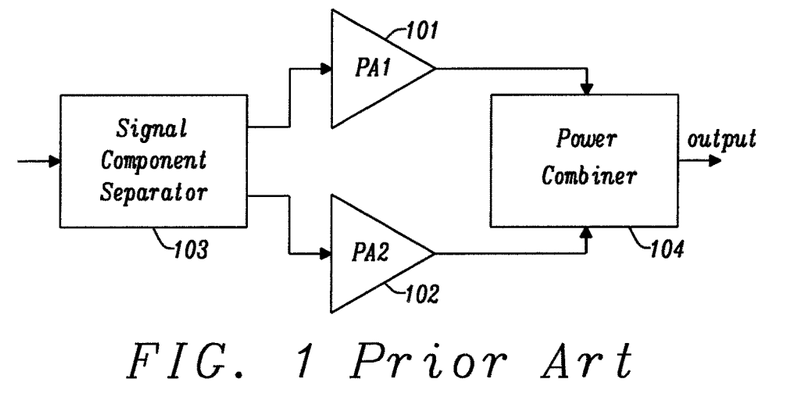
FIG. 1 shows a diagram of an outphasing amplifier system.

H. Chireix, "High power outphasing modulation," Proceedings of the Institute of Radio Engineers, Vol. 23, No. 11, pp. 1370-1392, November 1935, hereinafter: Chireix, discloses an outphasing amplifier system. An example of an outphasing amplifier system is illustrated in FIG. 1. In an outphasing amplifier as shown in FIG. 1, the amplitude modulated (AM) signal is input to and split by a signal component separator 103 into two substantially constant envelope but phase modulated signals, so-called outphased signals. These two outphased modulated signals are then amplified by two identical amplifiers 101 and 102, respectively. The amplified signals produced by the amplifiers 101 and 102 are input to a power combiner 104. The power combiner 104 combines the two phase modulated signals into an amplified version of the original AM modulated signal that was the input of the signal component separator 103.

Figure 2A:
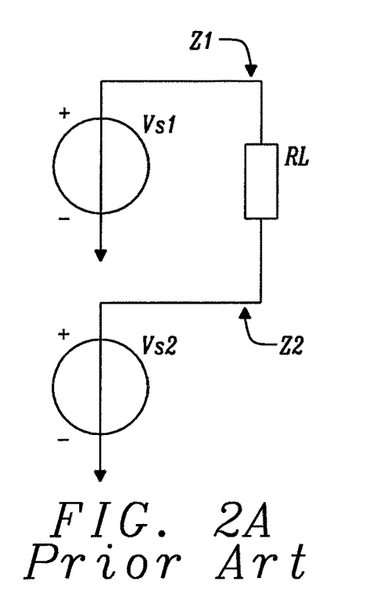
FIG. 2A shows a diagram of an implementation of a power combiner.

FIG. 2A illustrates certain principles of a power combiner 104. The voltage sources $V_{s1}$ and $V_{s2}$ represent the output of the power amplifier 101 and 102, respectively. The differential resistor $R_L$ represents a load.

The outphased sources may be represented, for example, by $$V_{s1} = V(\cos\phi + j\sin\phi)$$

$$V_{s2} = V(\cos\phi - j\sin\phi).$$

wherein V denotes a voltage and j denotes the imaginary unit, and the outphasing angle is $$\phi = \arcsin\left[\frac{A(t)}{A_{max}}\right].$$

Herein, A(t) denotes the original amplitude modulated component of the input signal of the power combiner 104 and $A_{max}$ denotes a maximum value of A(t).

The differential voltage across the load $R_L$ is $V_L = V_{s1} - V_{s2} = 2Vj\sin\phi$. When $\phi$ is 90 degrees, maximum voltage swing may be obtained, for a $\phi$ of 0 degrees the differential voltage may be also 0 V.

The impedance each voltage source sees, is a function of the outphasing angle. The impedance $Z_1$ seen by voltage source $V_{s1}$, and the impedance at $Z_2$ as seen by the voltage source $V_{s2}$ have been indicated in FIG. 2A.

$$Z_1 = \frac{V_{s1}}{\left(\frac{V_{s1} - V_{s2}}{R_L}\right)} = R_L \frac{\cos\Phi + j\sin\Phi}{2j\sin\Phi} = \frac{R_L}{2}(1 - j\cot[\phi]),$$

$$Z_2 = \frac{R_L}{2}(1 + j\cot[\phi]) = Z_1^*.$$

Rewriting the impedance to a parallel equivalent provides:

$$Y_1 = \frac{1}{Z_1} = \frac{2j\sin(\phi)}{R_L(\cos\Phi + j\sin\Phi)}.$$

Figure 2B:
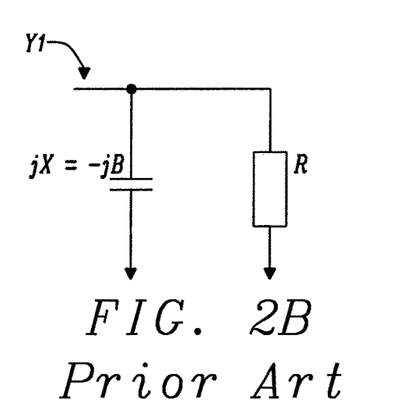
FIGS. 2B and 2C show diagrams of impedances related to FIG. 2A.
Figure 2C:
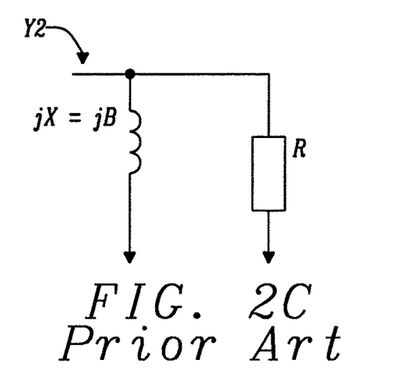

FIG. 2B shows a diagram of $Y_1$, the parallel equivalent of impedance $Z_1$. FIG. 2C shows a diagram of $Y_2$, the parallel equivalent of impedance $Z_2$.

Multiplying with the complex conjugate and simplifying yields:

$$Y_1 = \frac{2\sin^2\phi}{R_L} + j\frac{\sin(2\phi)}{R_L}.$$

The parallel equivalent circuit $Y_1$ is shown in FIG. 2B with $$B = \frac{R_L}{\sin(2\phi)},$$

$$R = \frac{R_L}{2\sin^2\phi}.$$

Similarly, the parallel equivalent circuit $Y_2$, which is the complex conjugate of $Z_2$, is shown in FIG. 2C.

When the output power is backed off and $\phi$ approaches 0, the reactive component value increases, which is undesirable for the efficiency. To compensate the efficiency loss for a certain outphasing angle, shunt reactances can be placed in parallel to cancel the reactive part of the load ($Z_1$ and $Z_2$), as disclosed by Chireix.

Figure 3A:
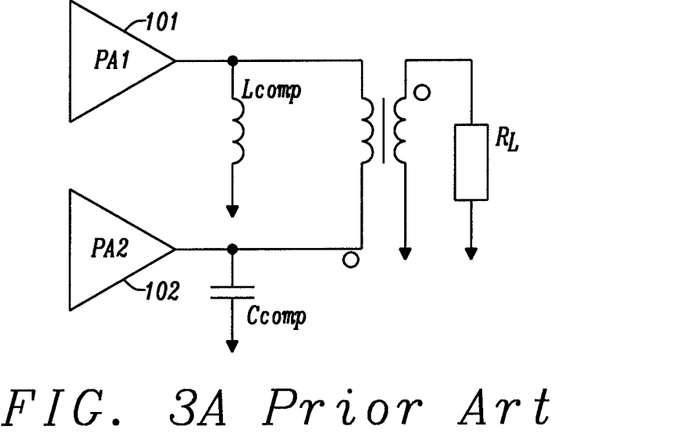
FIG. 3A shows a power combiner using a transformer.

A non-isolating power combiner may be implemented with one or multiple transformers arranged in series, parallel or a combination of both. The simplest implementation is shown in FIGS. 2A, 2B and 2C, in which the load each PA sees is a function of the outphasing angle. To compensate the reactive part of each PA load at a certain outphasing angle, a compensation inductor $L_{comp}$ and a capacitor $C_{comp}$ can be added, as shown in FIG. 3A.

Figure 3B:
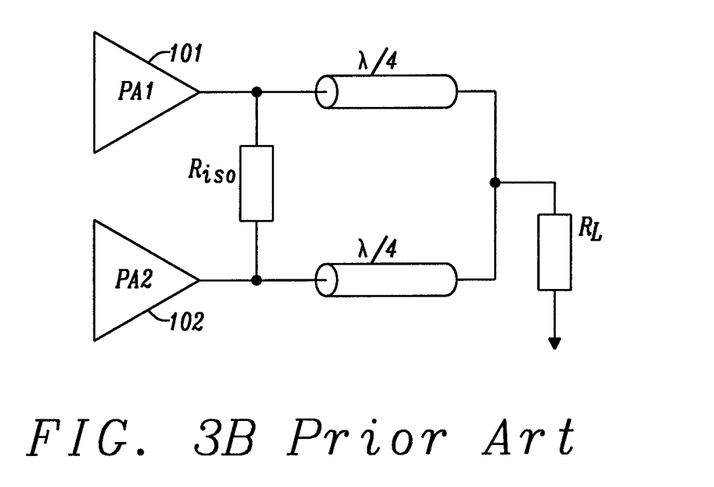
FIG. 3B shows a power combiner using a quarter wave line.

An isolating Wilkinson power combiner, shown in FIG. 3B, uses quarter wave ($\lambda/4$) transmission lines and forms a constant load for each PA, at the cost of a dissipating isolation resistor ($R_{iso}$). If the isolation resistor is omitted, the combiner may behave as a non-isolating Chireix combiner.

Disadvantages of the implementations of power combiners described above, include that transformers use up large chip areas and are thus expensive elements. Transformers tend to be quite lossy or area consuming at industrial, scientific and medical (ISM) frequencies. Quarter wave transmission lines use up an even larger chip area and are only suited for chip integration at frequencies much above the ISM band. Load compensation $C_{comp}$ and $L_{comp}$ takes up additional elements, which take up further space on a chip.

Wenhua Chen, Karun Rawat, Fadhel M., "Multiband RF Circuits and Techniques for Wireless Transmitters", discloses outphasing technique with a power combiner that sums the signals at the output of the power amplifiers to recover the amplitude modulation of the original signal. The isolated combiners such as Wilkinson or hybrid combiners are matched at all input and output ports independently from the magnitude and phase of their input signals. When input signals are out-of-phase, the mean efficiency degrades. The use of nonisolated power combiners, such as the Chireix combiner, avoids the power loss. However, the loads presented by the combiner at its input ports vary as a function of magnitudes and phases of the input signals. A cross-load modulation occurs between input ports. The PA's behavior, such as the gain, output power, and DC consumption, may vary. This type of combiners result in degradation of system linearity.

SUMMARY

It is an object of the invention to address at least one of the above-mentioned drawbacks, or provide at least one of the advantages mentioned below.

According to an aspect of the invention, a power combiner for an outphasing amplifier system comprises an output terminal;

a first input terminal, a first inductor, and a first capacitor, wherein the first input terminal is connected to ground via the first inductor and the first input terminal is connected to the output terminal via the first capacitor; and a second input terminal, a second capacitor, and a second inductor, wherein the second input terminal is connected to ground via the second capacitor and the second input terminal is connected to the output terminal via the second inductor.

This power combiner can be integrated on a chip with relatively little area consumption. The lumped element implementation of the power combiner makes the solution well suited for on-chip implementation, even at lower frequencies for which quarter wave lines would be relatively large.

The first capacitor may have a same capacitance $C_m$ as the second capacitor, and/or the first inductor may have a same inductance $L_m$ as the second inductor. This may provide a good performance for combining the outphased signals.

The second capacitor may have a capacitance $C_{tot}$ substantially equal to a capacitance of a parallel combination of a capacitor having a capacitance $C_m$ equal to the capacitance of the first capacitor and a compensation capacitance $C_{comp}$, and the first inductor may have an inductance $L_{tot}$ substantially equal to an inductance of a parallel combination of an inductor having an inductance $L_m$ equal to the inductance of the second inductor and a compensation inductance $L_{comp}$. This provides a way to compensate for an undesired experienced impedance.

The first input terminal may be further connected to ground via a first compensation impedance. Additionally or alternatively, the second input terminal may be further connected to ground via a second compensation impedance. This may help to remove or reduce the effect of the impedance $Z_1$ and/or $Z_2$, described above.

The first compensation impedance may comprise a capacitance and the second compensation impedance comprises a inductor. Alternatively, the first compensation impedance may comprise a inductor and the second compensation impedance may comprise a capacitance. This allows to optimize the power combiner for differently configured signal component separator and power amplifiers.

The first inductor may have an inductance substantially equal to an inductance of a parallel combination of the second inductor and a first compensation inductance. The second capacitor may have a capacitance substantially equal to a capacitance of a parallel combination of the first capacitor and a second compensation capacitance. This feature allows to integrate the compensation conductor into the first inductor and to integrate the compensation capacitance into the second capacitance. This may reduce complexity of the components.

At least one of the first compensation impedance and the second compensation impedance may be adjustable. This allows to optimize the circuit for different specific outphasing angles.

The first capacitor and the first inductor may be configured to cause a phase shift of +90 degrees of a signal at the first input terminal at a certain resonance frequency or frequency of operation, and the second inductor and the second capacitor may be configured to cause a phase shift of −90 degrees of a signal at the second input terminal at the resonance frequency or frequency of operation. This way, the outphased signal may be properly converted back into an amplitude-modulated signal.

For example, $$C_m = \frac{1}{\left(\omega \cdot \sqrt{R_s \cdot R_l}\right)} \text{ and } L_m = \frac{\sqrt{R_s \cdot R_l}}{\omega},$$

wherein $\omega = 2\pi f_{res}$, wherein $f_{res}$ is a resonance frequency or frequency of operation, $R_l$ denotes the resistance of a load connected to the output terminal, and $R_s$ denotes an optimal load resistance for a power amplifier. This allows to optimize the power combiner for the resistance and frequency of the system employed.

For example, $$L_{comp} = \frac{R_l}{\omega \sin(2\phi_{comp})} \text{ and } C_{comp} = \frac{\sin(2\phi_{comp})}{\omega R_l},$$

wherein $\phi_{comp}$ denotes a compensation angle. This allows the optimization of the power combiner depending on a desired compensation angle.

Another aspect of the invention provides an amplifier system, comprising a signal component separator for converting an amplitude modulated (AM) signal into at least two outphased signals; at least two power amplifiers corresponding to the plurality of outphased signals, each power amplifier of the plurality of power amplifiers being configured to amplify one of the outphased signals, to obtain amplified outphased signals; and a power combiner comprising: an output terminal, a first input terminal, a first inductor, and a first capacitor, wherein the first input terminal is connected to ground via the first inductor and the first input terminal is connected to the output terminal via the first capacitor, and a second input terminal, a second capacitor, and a second inductor, wherein the second input terminal is connected to ground via the second capacitor and the second input terminal is connected to the output terminal via the second inductor, wherein the power amplifiers are configured to provide respective ones of the amplified outphased signals to the first input terminal of the power combiner and the second input terminal of the power combiner. This provides an improved amplifier.

According to another aspect of the invention, a method of a power combiner of an outphasing amplifier system comprises providing a first outphased signal to a first input terminal, wherein the first input terminal is connected to ground via a first inductor and the first input terminal is connected to an output terminal via a first capacitor, and providing a second outphased signal to a second input terminal, wherein the second input terminal is connected to ground via a second capacitor and the second input terminal is connected to the output terminal via a second inductor.

The person skilled in the art will understand that the features described above may be combined in any way deemed useful. Moreover, modifications and variations described in respect of the power combiner may likewise be applied to the method and to the amplifier, and modifications and variations described in respect of the method may likewise be applied to the power combiner and to the amplifier.

BRIEF DESCRIPTION OF THE DRAWINGS

In the following, aspects of the invention will be elucidated by means of examples, with reference to the drawings. The drawings are diagrammatic and may not be drawn to scale. Throughout the drawings, similar items may be denoted by the same reference numerals.

DESCRIPTION

Certain exemplary embodiments will be described in greater detail, with reference to the accompanying drawings.

The matters disclosed in the description, such as detailed construction and elements, are provided to assist in a comprehensive understanding of the exemplary embodiments. Accordingly, it is apparent that the exemplary embodiments can be carried out without those specifically defined matters. also, well-known operations or structures are not described in detail, since they would obscure the description with unnecessary detail.

Figure 4A:
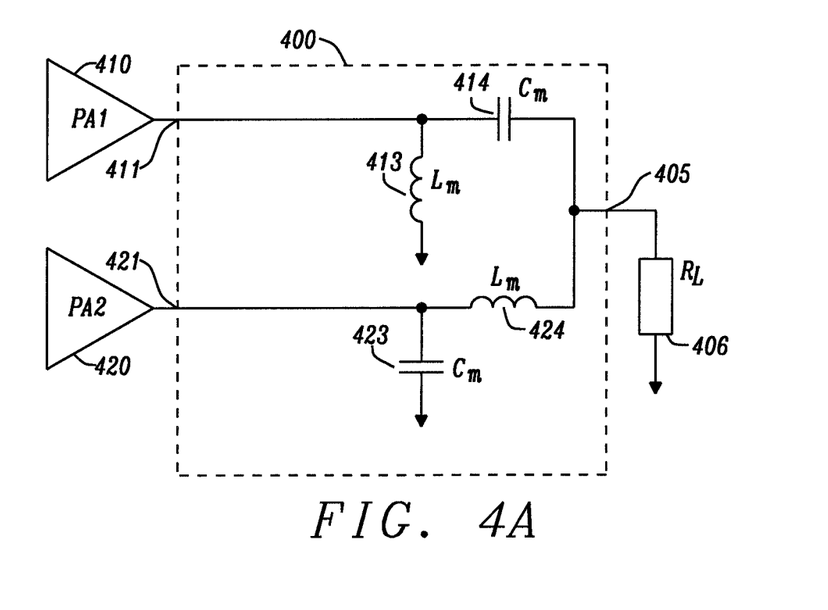
FIG. 4A shows a diagram of a power combiner.

FIG. 4A shows a lumped outphasing power combiner based on an LC balun. The power combiner comprises a first input terminal 411, a second input terminal 421, and an output terminal 405. The input terminals 411, 421 may be connected to the output of respective power amplifiers 410, 420 of the outphasing amplifier system. The output terminal 405 may be connected to any load 406. For example, the outphasing power combiner 400 may be a novel implementation of the power combiner 104 of FIG. 1.

The power combiner 400 comprises a first inductor 413, and a first capacitor 414. The first input terminal 411 is connected to ground via the first inductor 413 and the first input terminal 411 is connected to the output terminal 405 via the first capacitor 414. That is, one terminal of the first inductor 413 is connected to the first input terminal 411 and another terminal of the first inductor 413 is connected to a ground. A first terminal of the first capacitor is connected to the first input terminal 411, and another terminal of the first capacitor is connected to the output terminal 405. The compensation capacitor 412 is an optional component, which may be omitted in certain implementations.

The power combiner 400 further comprises a second capacitor 423, and a second inductor 424. The second input terminal 421 is connected to ground via the second capacitor 423 and the second input terminal 421 is connected to the output terminal 405 via the second inductor 424. That is, one terminal of the second capacitor 423 is connected to the second input terminal 421, and another terminal of the second capacitor 423 is connected to a ground. One terminal of the second inductor 424 is connected to the second input terminal 421, and another terminal of the second inductor 424 is connected to the output terminal 405. The compensation inductor 422 is an optional component, which may be omitted in certain implementations.

By means of the compensation shunt components 413 and 423, the efficiency can be restored to maximum for a certain outphasing angle. As an implementation example, the signal component separator 103 may generate constant envelope signals. The power amplifiers 410, 420 may be implemented as nonlinear switched mode power amplifiers, which may be highly efficient.

The second capacitor 423 and the second inductor 424 may be referred to as a low-pass LC section. This low-pass LC section may generate a phase shift of −90 degrees at its resonance frequency. The first inductor 413 and the first capacitor 414 may be referred to as a high-pass LC section. This high-pass LC section may generate a phase shift of +90 degrees at its resonance frequency. Both sections may have the same resonance frequency. If the second input terminal 421 is provided with a signal having a 180 degrees phase, the phase shift at the output terminal 405 will be +90 degrees (i.e., 180-90 degrees phase shift). If the first input terminal 411 is provided with a signal having a 0 degrees phase, the phase shift at the output terminal 405 will also become +90 degrees (i.e., 0+90 degrees phase shift). To achieve this, the first capacitor 414 may have a same capacitance as the second capacitor 423 and the first inductor 413 may have a same inductance as the second inductor 424.

In other words, at the output terminal 405 both signals may have the same phase and sum up. The 0 and 180 degrees signals provided at the first and second input terminals, respectively, may be regarded as a differential signal (balanced) which gets converted to a single ended (unbalanced) signal by the combiner 400.

In certain embodiments, the capacitance $C_m$ of the first capacitor 414 and the second capacitor 423 may be defined as:

$$C_m = \frac{1}{\left(\omega \cdot \sqrt{R_s \cdot R_1}\right)}.$$

Moreover, the inductance $L_m$ of the first inductance 413 and the second inductance 424 may be defined as:

$$L_m = \frac{\sqrt{R_s \cdot R_l}}{\omega}.$$

In the above two equations, $\omega = 2\pi f_{res}$, wherein $f_{res}$ is the resonance frequency of the power combiner, more particularly of the LC combination 413, 424, 414, 423. This resonance frequency $f_{res}$ may be chosen equal to the operating frequency of the outphasing amplifier system containing the power combiner. Therefore, the resonance frequency may alternatively be referred to as "frequency of operation".

Moreover, $R_l$ denotes the resistance of the load 406, for example an antenna load. $R_s$ denotes an optimal load resistance for the power amplifiers. The optimal load resistance may be determined, for example, by simulations of the amplifiers (PA's). It is the resistance for which the amplifiers will deliver maximum output power.

Figure 4B:
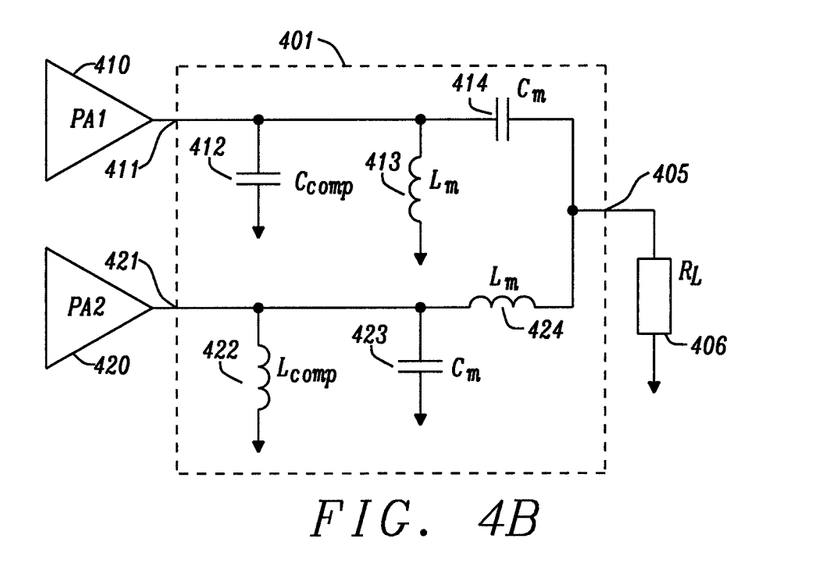
FIG. 4B shows a diagram of a power combiner with compensation impedances.

FIG. 4B illustrates that the power combiner may further (optionally) comprise a first compensation impedance and a second compensation impedance. These compensation impedances may be compensating for the impedances $Z_1$ and $Z_2$, described above with reference to FIG. 2A to 2C. The kind of compensation impedance (e.g. inductor or capacitor) may depend on the way in which the signals are separated by the signal component separator 103. In case the compensation impedances are present, the first input terminal 411 may be further connected to ground via the first compensation impedance, and the second input terminal 421 may be further connected to ground via the second compensation impedance.

In the implementation shown in FIG. 4B, the first compensation impedance comprises a capacitance 412 and the second compensation impedance comprises a inductor 422.

Figure 5:
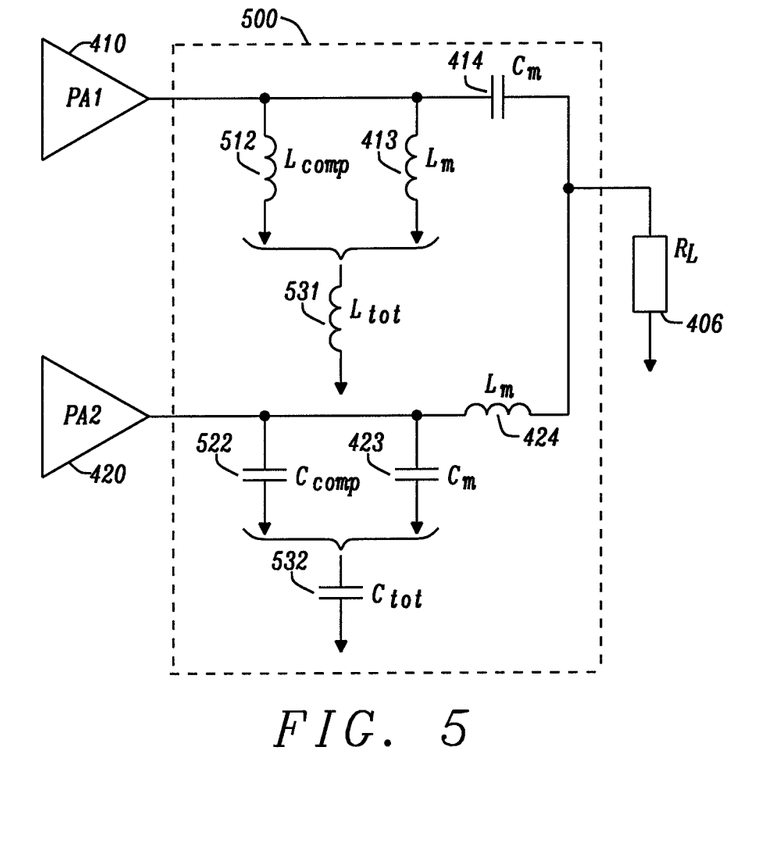
FIG. 5 shows a diagram of a power combiner.

FIG. 5 shows an example of a power combiner 500 with a different implementation of the compensation impedances. In FIG. 5, the first compensation impedance comprises a inductor 512, and the second compensation impedance comprises a capacitance 522. Otherwise, the power combiner of FIG. 5 is identical to the power combiner of FIG. 4B. The different configurations of FIG. 4B and FIG. 5 may make the power combiner more suitable for differently separated signal components.

Figure 6:
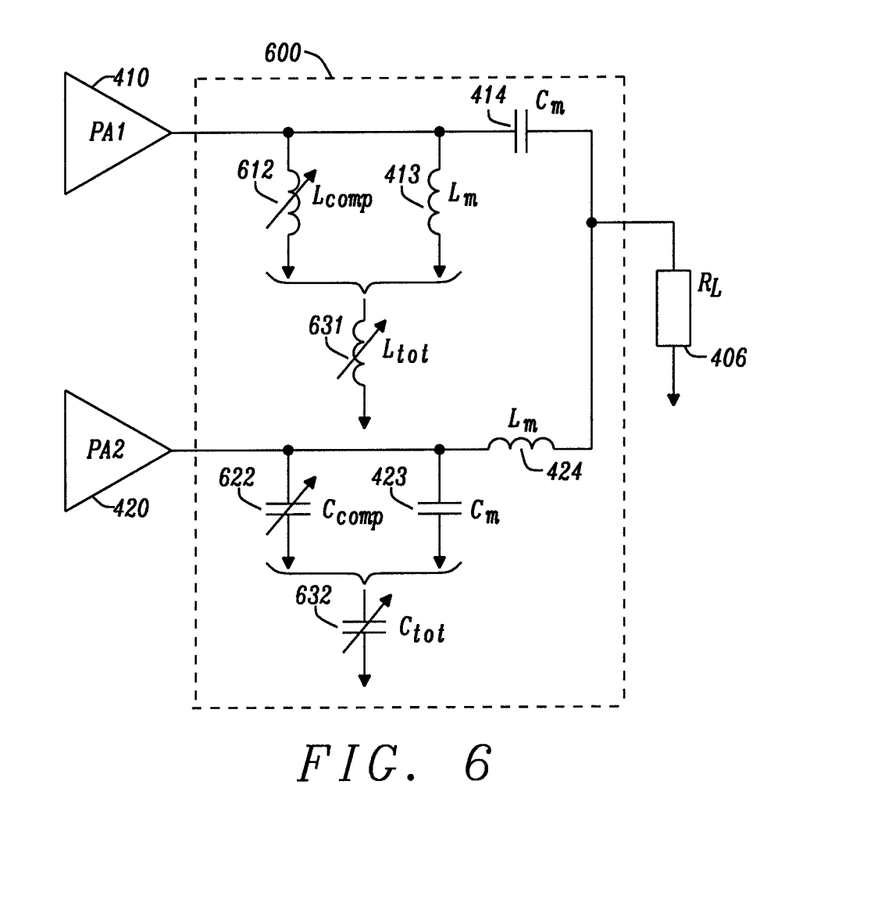
FIG. 6 shows a diagram of a power combiner.

The compensation inductor and capacitor values $L_{comp}$ and $C_{comp}$, as shown in FIG. 5 and FIG. 6, can be calculated, for example, by making the reactive parts $L_{comp}$ and $C_{comp}$ equal but opposite sign with respect to the virtual load reactances $Z_1$ and $Z_2$. For example, for a compensation angle $\phi_{comp}$:

$$L_{comp} = \frac{R_1}{\omega \sin(2\phi_{comp})},$$

$$C_{comp} = \frac{\sin(2\phi_{comp})}{\omega R_1}.$$

In certain implementations, as tentatively illustrated in FIG. 5, the compensation inductor 512 and the first inductor 413 may be combined as a single inductor 531 that replaces the compensation inductor 512 and the first inductor 413. Similarly, the compensation capacitor 522 and the second capacitor 423 may be combined as a single capacitor 532 that replaces the compensation capacitor 522 and the second capacitor 423. This configuration may further reduce the chip surface needed to implement the power combiner.

The inductance $L_{tot}$ of the combined inductor 531 may be equal to the inductance of the parallel combination of the compensation inductor and balun inductor, as follows:

$$L_{tot} = \frac{L_m L_{comp}}{L_m + L_{comp}}.$$

The capacitance $C_{tot}$ of the combined capacitor 532 may be equal to the capacitance of the parallel combination of the compensation and balun capacitor, as follows:

$$C_{tot} = C_m + C_{comp}.$$

FIG. 6 shows a diagram of another example of a power combiner 600, in which the compensation impedances 612, 622 have been made variable. For example, the compensation impedances may be made switchable (at discrete levels) or tunable (at continuous levels). For example, the inductance of the compensation inductor 612 may be made variable, and/or the capacity of the compensation capacitor 622 may be made variable. As shown in FIG. 6, the variable compensation impedances may be implemented as separate component next to the first inductor 413 and the second capacitor 423. Alternatively, as also shown in FIG. 6, the variable inductor 612 and the first inductor 413 may be combined into a single variable inductor 631. Likewise, the variable capacitor 622 and the second capacitor 423 may be combined into a single variable capacitor 632.

Although not illustrated, in the configuration shown in FIG. 4B it is also possible to make the compensation capacitor 412 and the compensation inductor 422 variable.

Figure 7A:
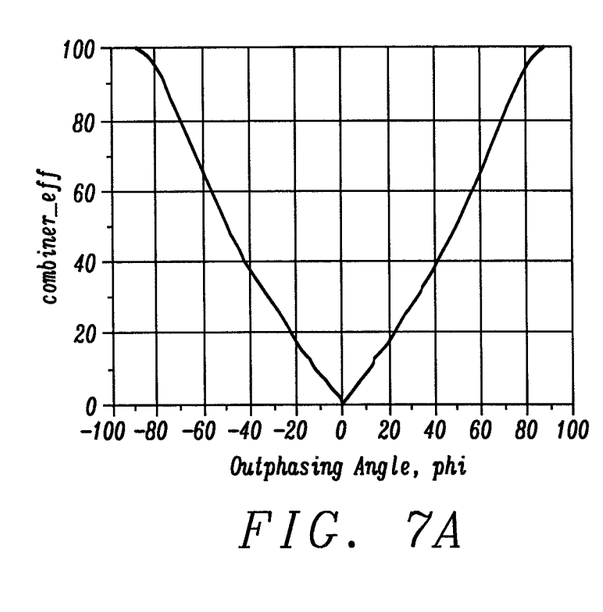
FIGS. 7A and 7B show diagrams of efficiency of a particular power combiner.
Figure 7B:
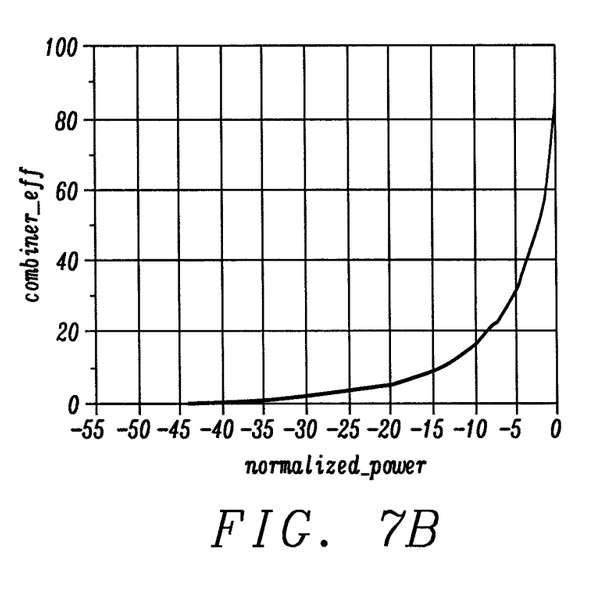

FIG. 7A and FIG. 7B show examples of the efficiency of the power combiner 400 of FIG. 4A, according to a simulation with ideal components. Plotted in FIG. 7A is combiner efficiency ("combiner_eff") versus outphasing angle ("phi") in degrees, and plotted in FIG. 7B is combiner efficiency ("combiner_eff") versus normalized output power ("normalized_power") in decibel (dB). Herein, the normalized output power is the output power normalized with respect to the maximum output power.

As a measure for the power amplifier and combined efficiency, the efficiency may be defined as real power delivered to the load divided by the magnitude of the complex power drawn from the ideal voltage sources.

As expected above, the maximum output power may be achieved in certain embodiments for an outphasing angle of 90 degrees, so 180 degrees of phase difference between the two power amplifiers. Efficiency and output power may drop as the outphasing angle is decreased, due to an increase of the virtual reactive component value ($Z_1$ and $Z_2$), as explained above with reference to FIG. 2.

Figure 8A:
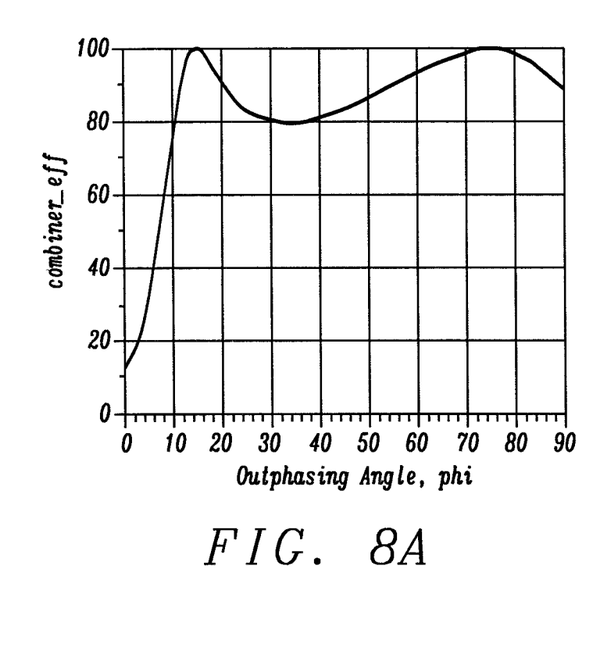
FIGS. 8A and 8B show diagrams of efficiency of a particular power combiner.
Figure 8B:
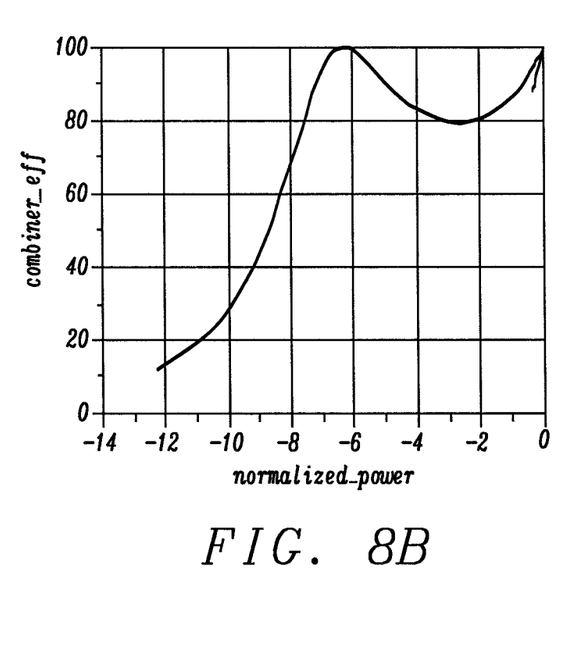

FIG. 8A and FIG. 8B show examples of the efficiency of the power combiner 401 of FIG. 4B, according to simulation results based on ideal lumped components and presence of compensation impedances for a compensation angle $\phi_{comp}$ of 15 degrees. The combiner efficiency has, in this case, two peaks, at 15 degrees and at 75 degrees. The efficiency plotted versus normalized power shows that two power levels can be generated with equal maximum efficiency: one power level at a normalized power of 0 dB and one at a −6 dB power level.

Figure 9A:
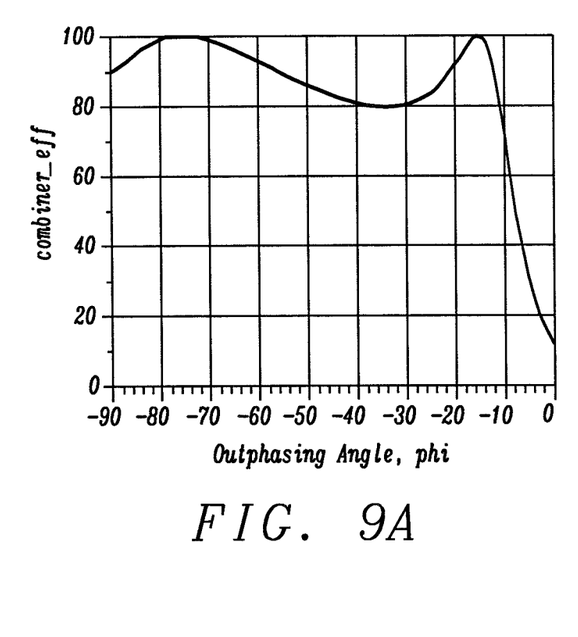
FIGS. 9A and 9B show diagrams of efficiency of a particular power combiner.
Figure 9B:
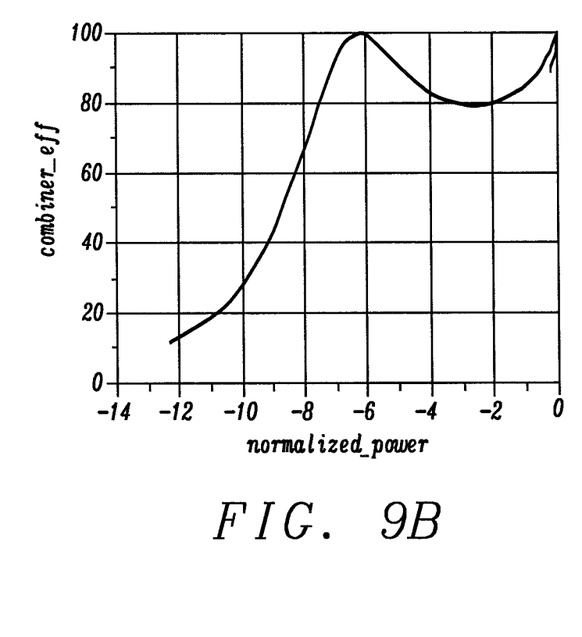

FIG. 9A and FIG. 9B show examples of the efficiency of the power combiner 500 shown in FIG. 5. Because the compensation capacitor and the compensation impedance of power combiner 500 have swapped placed compared to the power combiner 401, the compensation realized by power combiner 500 may occur for negative outphasing angles. FIG. 9A and FIG. 9B show plots of efficiency according to simulation results based on ideal lumped components and presence of compensation impedances for a compensation angle $\phi_{comp}$ of −15 degrees. Again, maximum efficiency may be realized at a normalized power of 0 dB and normalized power at −6 dB.

As disclosed hereinabove with reference to FIG. 6, the compensation capacitor and inductor can be made switchable (discrete levels) or tunable (continuous levels) so that over a wide range of powers a constant efficiency can be achieved.

The examples and embodiments described herein serve to illustrate rather than limit the invention. The person skilled in the art will be able to design alternative embodiments without departing from the spirit and scope of the present disclosure, as defined by the appended claims and their equivalents. Reference signs placed in parentheses in the claims shall not be interpreted to limit the scope of the claims. Items described as separate entities in the claims or the description may be implemented as a single hardware or software item combining the features of the items described.

What is claimed is:

1. A power combiner for an outphasing amplifier system, comprising
    an output terminal;
    a first input terminal, a first inductor, and a first capacitor, wherein the first input terminal is connected to ground via the first inductor and the first input terminal is connected to the output terminal via the first capacitor; and
    a second input terminal, a second capacitor, and a second inductor, wherein the second input terminal is connected to ground via the second capacitor and the second input terminal is connected to the output terminal via the second inductor,
wherein
    the second capacitor has a capacitance $C_{tot}$ substantially equal to a capacitance of a parallel combination of a capacitor having a capacitance $C_m$ equal to the capacitance of the first capacitor and a compensation capacitance $C_{comp}$, and
    the first inductor has an inductance $L_{tot}$ substantially equal to an inductance of a parallel combination of an inductor having an inductance $L_m$ equal to the inductance of the second inductor and a compensation inductance $L_{comp}$.

2. The power combiner of claim 1, wherein
    the first input terminal is further connected to ground via a first compensation impedance, and
    the second input terminal is further connected to ground via a second compensation impedance.

3. The power combiner of claim 2, wherein the first compensation impedance comprises a capacitance and the second compensation impedance comprises a inductor, or the first compensation impedance comprises a inductor and the second compensation impedance comprises a capacitance.

4. The power combiner of claim 1, wherein at least one of the first compensation impedance and the second compensation impedance is adjustable.

5. A power combiner for an outphasing amplifier system, comprising
    an output terminal;
    a first input terminal, a first inductor, and a first capacitor, wherein the first input terminal is connected to ground via the first inductor and the first input terminal is connected to the output terminal via the first capacitor; and
    a second input terminal, a second capacitor, and a second inductor, wherein the second input terminal is connected to ground via the second capacitor and the second input terminal is connected to the output terminal via the second inductor,
    wherein the first capacitor and the first inductor are configured to cause a phase shift of +90 degrees of a signal at the first input terminal at a certain frequency of operation, and the second inductor and the second capacitor are configured to cause a phase shift of −90 degrees of a signal at the second input terminal at the frequency of operation.

6. A power combiner for an outphasinq amplifier system, comprising
    an output terminal;
    a first input terminal, a first inductor, and a first capacitor, wherein the first input terminal is connected to ground via the first inductor and the first input terminal is connected to the output terminal via the first capacitor; and
    a second input terminal, a second capacitor, and a second inductor, wherein the second input terminal is connected to ground via the second capacitor and the second input terminal is connected to the output terminal via the second inductor,
wherein $$C_m = \frac{1}{\left(\omega \cdot \sqrt{R_s \cdot R_l}\right)} \text{ and}$$

$$L_m = \frac{\sqrt{R_s \cdot R_l}}{\omega},$$

wherein $$\omega = 2\pi f_{res},$$

wherein $f_{res}$ is a frequency of operation, $R_l$ denotes the resistance of a load connected to the output terminal, and $R_s$ denotes an optimal load resistance for a power amplifier.

7. The power combiner of claim 6, wherein $$L_{comp} = \frac{R_l}{\omega \sin(2\phi_{comp})} \text{ and}$$

$$C_{comp} = \frac{\sin(2\phi_{comp})}{\omega R_l},$$

wherein $\phi_{comp}$ denotes a compensation angle.

8. An amplifier system comprising a power combiner according to claim 1, the amplifier system further comprising
    a signal component separator for converting an amplitude modulated signal into at least two outphased signals;
    at least two power amplifiers corresponding to the plurality of outphased signals, each power amplifier of the plurality of power amplifiers being configured to amplify one of the outphased signals, to obtain amplified outphased signals; and wherein the power amplifiers are configured to provide respective ones of the amplified outphased signals to the first input terminal of the power combiner and the second input terminal of the power combiner.

9. A method of a power combiner of an outphasinq amplifier system, comprising providing a first outphased signal to a first input terminal, wherein the first input terminal is connected to ground via a first inductor and the first input terminal is connected to an output terminal via a first capacitor; and providing a second outphased signal to a second input terminal, wherein the second input terminal is connected to ground via a second capacitor and the second input terminal is connected to the output terminal via a second inductor, wherein the second capacitor has a capacitance $C_{tot}$ substantially equal to a capacitance of a parallel combination of a capacitor having a capacitance $C_m$ equal to the capacitance of the first capacitor and a compensation capacitance $C_{comp}$, and the first inductor has an inductance $L_{tot}$ substantially equal to an inductance of a parallel combination of an inductor having an inductance $L_m$ equal to the inductance of the second inductor and a compensation inductance $L_{comp}$.

10. The method of claim 9, wherein the first input terminal is further connected to ground via a first compensation impedance, and the second input terminal is further connected to ground via a second compensation impedance.

11. The method of claim 10, wherein the first compensation impedance comprises a capacitance and the second compensation impedance comprises a inductor, or the first compensation impedance comprises a inductor and the second compensation impedance comprises a capacitance.

12. The method of claim 9, wherein at least one of the first compensation impedance and the second compensation impedance is adjustable.

13. A method of a power combiner of an outphasinq amplifier system, comprising providing a first outphased signal to a first input terminal, wherein the first input terminal is connected to ground via a first inductor and the first input terminal is connected to an output terminal via a first capacitor; and providing a second outphased signal to a second input terminal, wherein the second input terminal is connected to ground via a second capacitor and the second input terminal is connected to the output terminal via a second inductor, wherein the first capacitor and the first inductor can cause a phase shift of +90 degrees of a signal at the first input terminal at a certain frequency of operation, and the second inductor and the second capacitor can cause a phase shift of −90 degrees of a signal at the second input terminal at the frequency of operation.

14. A method of a power combiner of an outphasing amplifier system, comprising providing a first outphased signal to a first input terminal, wherein the first input terminal is connected to ground via a first inductor and the first input terminal is connected to an output terminal via a first capacitor; and providing a second outphased signal to a second input terminal, wherein the second input terminal is connected to ground via a second capacitor and the second input terminal is connected to the output terminal via a second inductor, wherein $$C_m = \frac{1}{\left(\omega \cdot \sqrt{R_s \cdot R_l}\right)} \text{ and}$$

$$L_m = \frac{\sqrt{R_s \cdot R_l}}{\omega},$$

wherein $$\omega = 2\pi f_{res},$$

wherein $f_{res}$ is a frequency of operation, $R_l$ denotes the resistance of a load connected to the output terminal, and $R_s$ denotes an optimal load resistance for a power amplifier.

15. The method of claim 14, wherein $$L_{comp} = \frac{R_l}{\omega \sin(2\phi_{comp})} \text{ and}$$

$$C_{comp} = \frac{\sin(2\phi_{comp})}{\omega R_l},$$

wherein $\phi_{comp}$ denotes a compensation angle.

16. An amplifier system comprising a power combiner according to claim 5, the amplifier system further comprising a signal component separator for converting an amplitude modulated signal into at least two outphased signals;

at least two power amplifiers corresponding to the plurality of outphased signals, each power amplifier of the plurality of power amplifiers being configured to amplify one of the outphased signals, to obtain amplified outphased signals; and wherein the power amplifiers are configured to provide respective ones of the amplified outphased signals to the first input terminal of the power combiner and the second input terminal of the power combiner.

17. An amplifier system comprising a power combiner according to claim 6, the amplifier system further comprising a signal component separator for converting an amplitude modulated signal into at least two outphased signals;

at least two power amplifiers corresponding to the plurality of outphased signals, each power amplifier of the plurality of power amplifiers being configured to amplify one of the outphased signals, to obtain amplified outphased signals; and wherein the power amplifiers are configured to provide respective ones of the amplified outphased signals to the first input terminal of the power combiner and the second input terminal of the power combiner.

* * * * *